(12) United States Patent
Muraki et al.

(10) Patent No.: US 6,969,862 B2
(45) Date of Patent: Nov. 29, 2005

(54) CHARGED-PARTICLE-BEAM EXPOSURE APPARATUS AND METHOD OF CONTROLLING SAME

(75) Inventors: Masato Muraki, Tokyo (JP); Osamu Kamimura, Tokyo (JP); Masaki Takakuwa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/730,814

(22) Filed: Dec. 8, 2003

(65) Prior Publication Data

US 2004/0135102 A1  Jul. 15, 2004

(30) Foreign Application Priority Data

Dec. 13, 2002  (JP) .............................. 2002-362969

(51) Int. Cl.⁷ ......................................... H01J 37/304
(52) U.S. Cl. ................................................ 250/492.22
(58) Field of Search ...................... 250/492.22, 492.23, 250/398, 492; 430/296

(56) References Cited

U.S. PATENT DOCUMENTS

| | | | |
|---|---|---|---|
| 5,834,783 A | 11/1998 | Muraki et al. ............... | 250/398 |
| 5,929,454 A | 7/1999 | Muraki et al. ............ | 250/491.1 |
| 5,973,332 A | 10/1999 | Muraki et al. ........... | 250/492.2 |
| 5,981,954 A | 11/1999 | Muraki ....................... | 250/397 |
| 6,118,129 A * | 9/2000 | Oae et al. .............. | 250/492.22 |
| 6,137,113 A | 10/2000 | Muraki ................... | 250/492.22 |
| 6,166,387 A | 12/2000 | Muraki et al. ........... | 250/492.2 |
| 6,274,877 B1 | 8/2001 | Muraki ................... | 250/492.23 |
| 6,323,499 B1 | 11/2001 | Muraki et al. ......... | 250/499.22 |
| 6,521,392 B2 * | 2/2003 | Yahiro ........................ | 430/296 |
| 2002/0179855 A1 | 12/2002 | Muraki .................. | 250/492.22 |

* cited by examiner

*Primary Examiner*—Jack I. Berman
(74) *Attorney, Agent, or Firm*—Morgan & Finnegan, LLP

(57) ABSTRACT

In a charged-particle-beam exposure apparatus for exposing a wafer using a charged-particle beam, an electron beam emitted from an electron source serving as a source of charged particles is substantially collimated by a collimator lens and irradiates an aperture array (3), which has apertures for forming a plurality of electron beams used to expose a wafer. A current detector array has current detectors for measuring the intensities (currents) of electron beams at portions of the-aperture array other than where the apertures are present. During the wafer exposure operation, each current detector of the current detector array measures the intensity of the electron beam. The electron-beam intensity distribution is evaluated based upon the results of measurement and, when necessary, the optical power of electrostatic lenses that construct the collimator lens (2) is adjusted to uniformalize the electron-beam intensity distribution.

16 Claims, 10 Drawing Sheets

US 6,969,862 B2

CHARGED-PARTICLE-BEAM EXPOSURE APPARATUS AND METHOD OF CONTROLLING SAME

FIELD OF THE INVENTION

This invention relates to a charged-particle-beam exposure apparatus such as an electron-beam exposure apparatus or ion-beam exposure apparatus used in exposing semiconductor integrated circuits and the like, and controlling method thereof. More particularly, the present invention is ideal for application to an electron-beam exposure apparatus for drawing a pattern directly on a wafer by an electron beam or to an electron-beam exposure apparatus for irradiating a mask with an electron beam and projecting the electron beam from the mask onto a wafer via a demagnifying electron optics system to thereby expose the wafer.

BACKGROUND OF THE INVENTION

Examples of electron beam exposure apparatuses include an apparatus of the point-beam type which uses a beam in the shape of a spot, and an apparatus of the variable rectangular-beam type which uses a beam in the shape of a rectangular cross section whose size is variable.

The electron-beam exposure apparatus of the point-beam type draws using a single electron beam and is used exclusively for research and development purposes because of its low throughput. Though the electron-beam exposure apparatus of the variable rectangular-beam type has a throughput higher than that of the apparatus of the point-beam type by one to two orders, many problems still remain in terms of throughput in a case where a wafer is exposed to a pattern consisting of highly packed fine patterns on the order of 0.1 µm.

The stencil-mask type electron-beam exposure apparatus is an example of an apparatus that solves this problem. Specifically, this apparatus forms the desired pattern in a stencil mask as pattern through-holes and irradiates the stencil mask with an electron beam to thereby transfer the desired pattern to the sample surface via a demagnifying electron optics system. Another example of an apparatus that solves the above problem is a multi-electron beam exposure apparatus which irradiates a substrate having a plurality of apertures with an electron beam, irradiates the surface of a sample with a plurality of electron beams from the plurality of apertures, scans the plurality of electron beams across the sample surface by deflecting the electron beams, and turns the plurality of electron beams on and off individually in conformity with the pattern to be drawn, thereby drawing the pattern on the surface. A feature of both types of apparatus is that throughput can be improved by making the area exposed at one time, i.e., the area exposed, greater than that in the past.

However, with the stencil-mask type electron beam exposure apparatus, the pattern to be transferred will be distorted if the electron beam that irradiates the stencil mask exhibits non-uniform intensity in the irradiated area. With the multi-electron beam exposure apparatus, the pattern to be drawn will be distorted if the multiple electron beams exhibit a difference in intensity from one beam to the next. In particular, there will be a decline in the production yield of semiconductor integrated circuits if, during the exposure treatment, the electron-beam intensity distribution varies and becomes non-uniform or the multiple electron beams develop a difference in intensity.

In view of the problems set forth above, there is a need to implement highly reliable charged-particle-beam exposure by making it possible to control, in appropriate fashion, the intensity distribution of a charged-particle beam upon evaluating the uniformity of the charged-particle beam even during exposure.

SUMMARY OF THE INVENTION

In accordance with an embodiment of the present invention, there is provided a charged-particle-beam exposure apparatus for exposing a substrate using a charged-particle-beam, comprising:

a charged-particle source for emitting a charged-particle beam;

a detecting unit configured to detect intensity of that part of the charged-particle beam, which has been emitted from the charged-particle source, in an area not utilized in exposing the substrate; and an adjusting unit configured to adjust intensity distribution of the charged-particle beam based upon result of detection by the detecting unit.

Further, in accordance with another embodiment of the present invention, there is provided a method of controlling a charged-particle-beam exposure apparatus for exposing a substrate using a charged-particle beam, comprising:

a detecting step of detecting, by a detector provided for the purpose of detecting intensity of a charged-particle beam, intensity of that part of the charged-particle beam, which has been emitted from a charged-particle source, in an area not utilized in exposing the substrate; and an adjusting step of adjusting intensity distribution of the charged-particle beam based upon result of detection at the detecting step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

The embodiments that follow illustrate examples in which the present invention is applied to an electron-beam exposure apparatus, which is one example of a charged-particle-beam exposure apparatus. However, it goes without saying that the invention is similarly applicable to an exposure apparatus that uses an ion beam and not just an electron beam.

<First Embodiment>
<Description of components of electron beam exposure apparatus>

Figure 1:
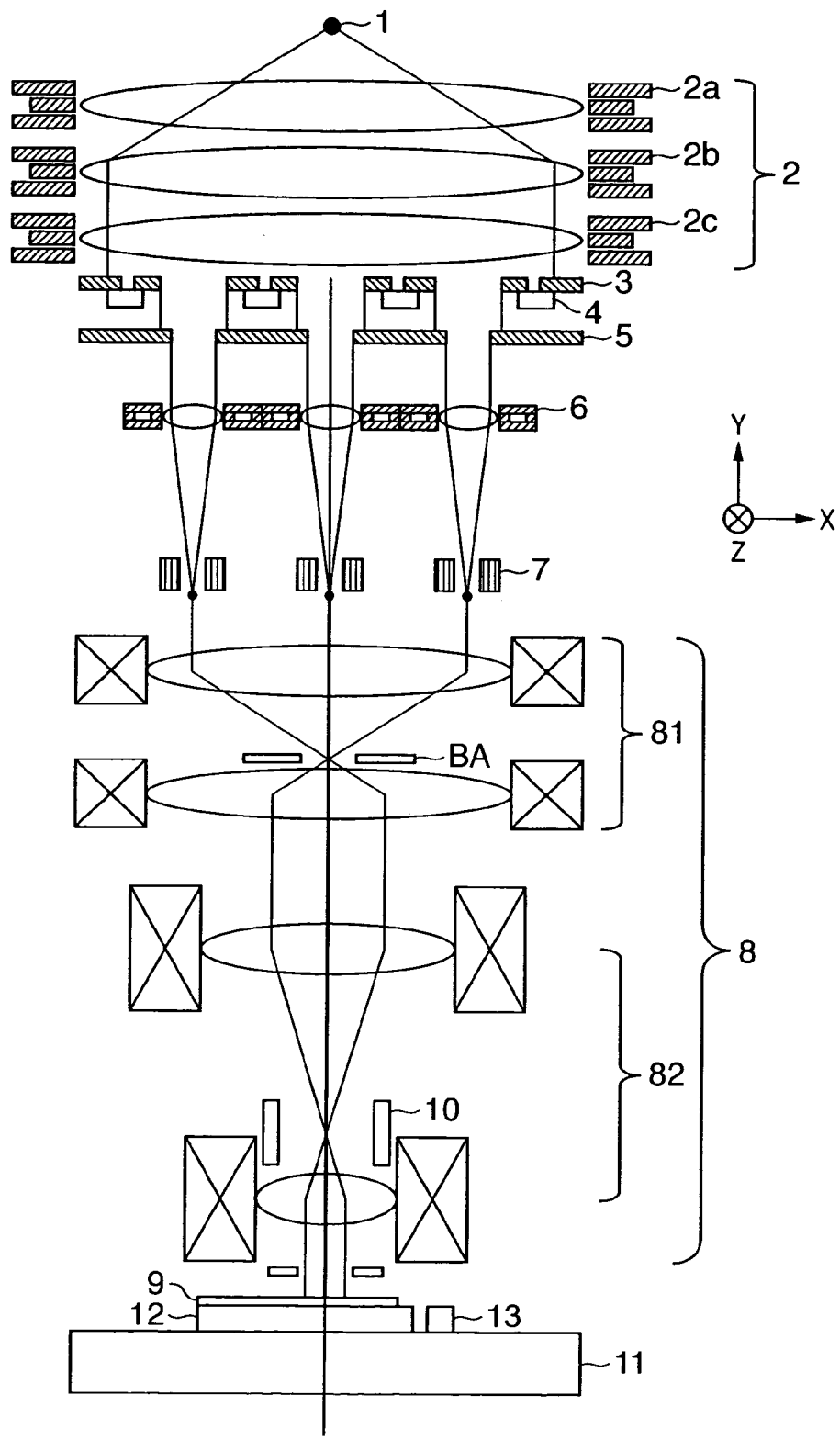
FIG. 1 is a diagram schematically illustrating the principal part of an electron-beam exposure apparatus according to a first embodiment of the present invention.

FIG. 1 is a diagram schematically illustrating the principal part of an electron-beam exposure apparatus according to a first embodiment of the present invention.

In FIG. 1, an electron beam generated by an electron gun (not shown) forms a crossover image. The crossover image shall be referred to below as an electron source, indicated at reference numeral 1. The electron beam emitted from the electron source 1 is made a substantially collimated electron beam by a collimator lens 2. The substantially collimated electron beam irradiates a pre-aperture array 3 having a plurality of apertures. The collimator lens 2 comprises electrostatic lenses 2a, 2b, 2c. The intensity distribution of the electron beam that irradiates the pre-aperture array 3 can be adjusted by regulating the electro-optical power (focal length) of at least two of the electrostatic lenses 2a, 2b, 2c.

Figure 2:
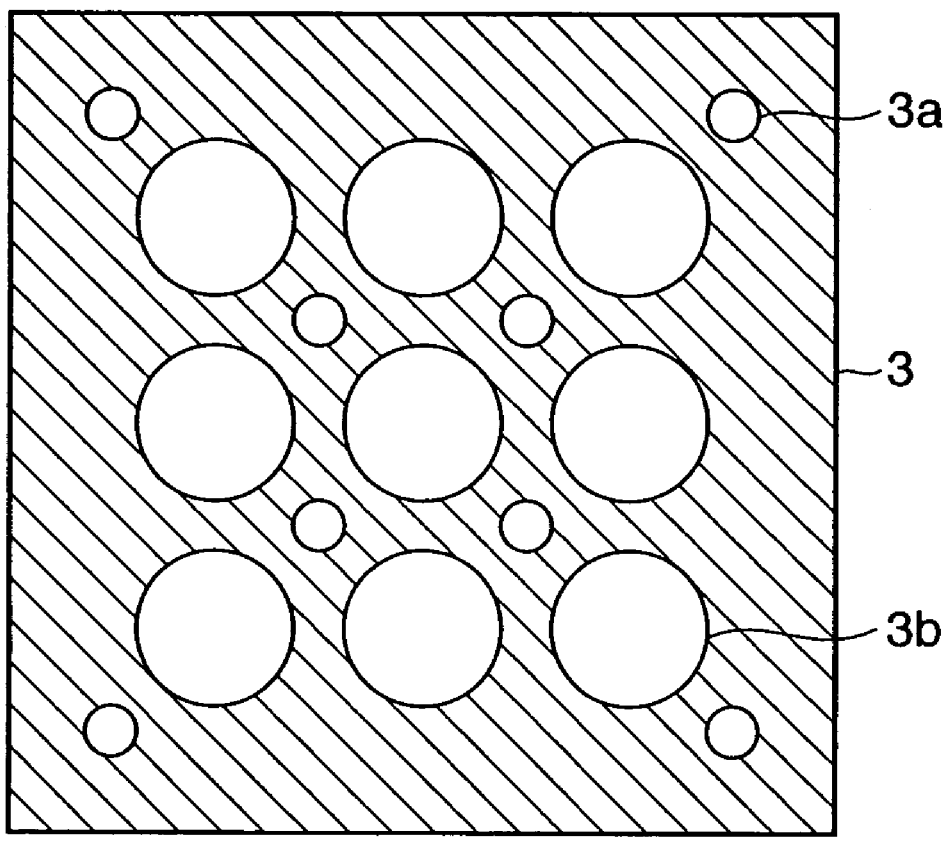
FIG. 2 is a diagram useful in describing the details of a pre-aperture array in the electron-beam exposure apparatus of FIG. 1.
Figure 3:
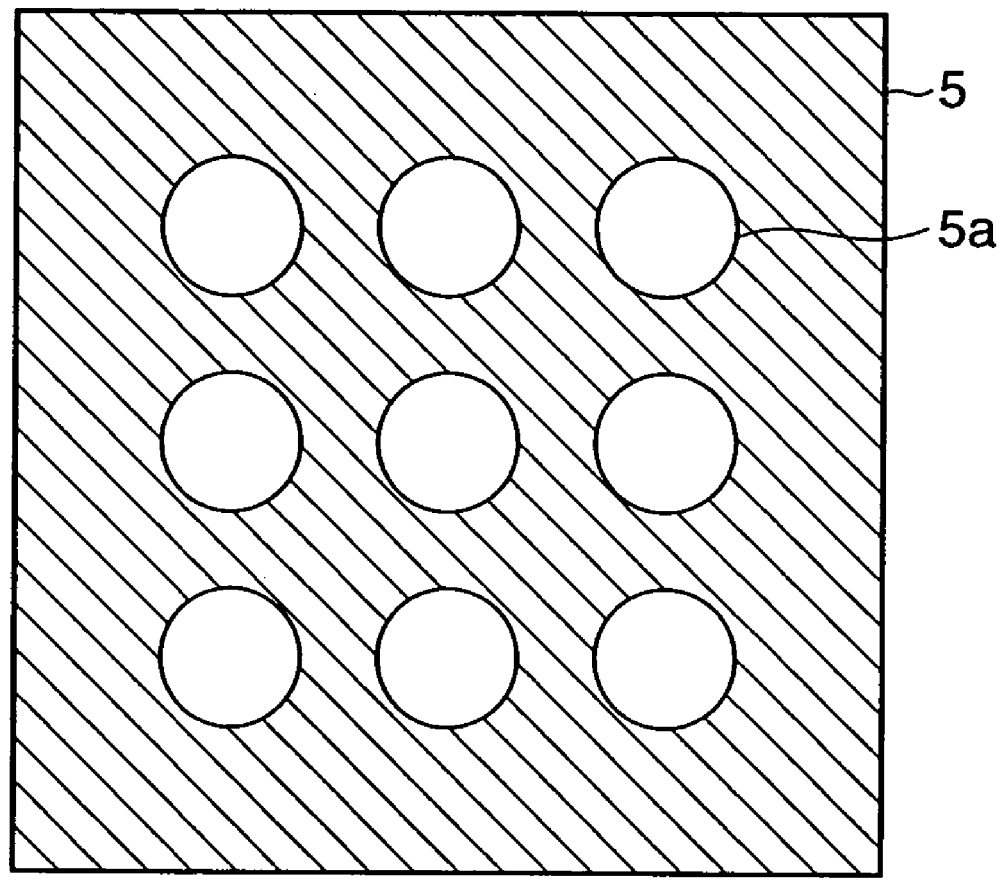
FIG. 3 is a diagram useful in describing the details of an aperture array in the electron beam exposure apparatus of FIG. 1.

As shown in FIG. 2, the pre-aperture array 3 has a plurality of small apertures 3a and a plurality of large apertures 3b. A current detector array 4 having current detectors is provided immediately below the small apertures 3a and is capable of detecting current (an electron beam) that has passed through each aperture 3a. An electron beam that has passed through a large aperture 3b, on the other hand, irradiates an aperture array 5. As shown in FIG. 3, the aperture array 5 has a plurality of apertures 5a sized to be smaller than the large apertures 3b of the per-aperture array 3. As a result, electron beams from the apertures 3b that irradiate the aperture array 5 are shaped by the apertures 5a.

With reference again to FIG. 1, the plurality of electron beams that have passed through the aperture array 5 form intermediate images of the electron source 1 owing to an electrostatic lens array 6 in which a plurality of electrostatic lens are formed. A blanker array 7 in which a plurality of blankers are formed is placed in the plane of the intermediate images.

Disposed downstream of the plane of the intermediate images is a demagnifying projection system 8 constituted by two stages of symmetric magnetic doublet lenses 81, 82. The demagnifying projection system 8 projects the plurality of intermediate images upon a wafer 9. At this time electron beams deflected by the blanker array 7 are blocked by a blanking aperture BA and therefore do not irradiate the wafer 9. On the other hand, electron beams not deflected by the blanker array 7 are not blocked by the blanking aperture BA and irradiate the wafer 9.

A main deflector 10 for displacing the plurality of electron beams simultaneously to desired positions in the X and Y directions is disposed in a lower tablet lens 82. An XY stage 11 carries the wafer 9 and is capable of moving the wafer in the X and Y directions, which are orthogonal to the optic axis. Disposed on the XY stage 11 are an electrostatic chuck 12 for securing the wafer 9, and a Faraday cup 13 for measuring the amount of exposing current of the electron beams.

<Description of control system configuration>

Next, the control system configuration of the electron beam exposure apparatus of the first embodiment will be described with reference to FIG. 4.

Figure 4:
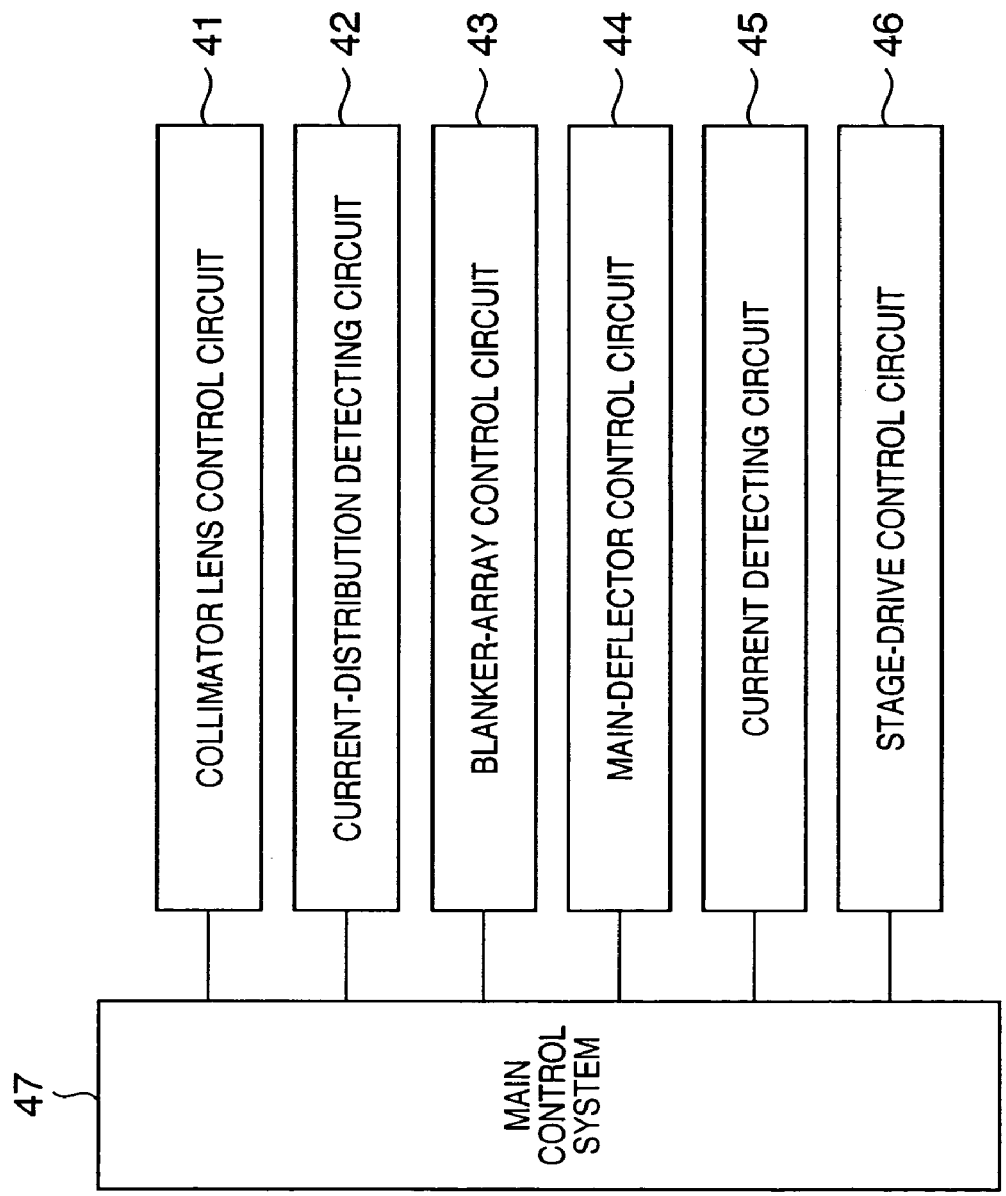
FIG. 4 is a diagram useful in describing the system configuration of the electron-beam exposure apparatus of the first embodiment.

A collimator lens control circuit 41 in FIG. 4 is a circuit for controlling the intensity distribution of the electron beam that irradiates the pre-aperture array 3 by regulating the electro-optical power (focal length) of at least two of the electrostatic lenses 2a, 2b, 2c. A current-distribution detecting circuit 42 processes the signal from the current detector array 4. A blanker-array control circuit 43 controls individually the plurality of blankers that construct the blanker array 7. A main-deflector control circuit 44 controls the main deflector 10, and a current detecting circuit 45 processes a signal from the Faraday cup 13. A stage-drive control circuit 46 controls the driving of the XY stage 11 in cooperation with a laser interferometer (not shown) that detects the position of the stage. A main control system 47 controls the above-mentioned circuits and manages the overall electron beam exposure apparatus.

<Description of operation>

Figure 5:
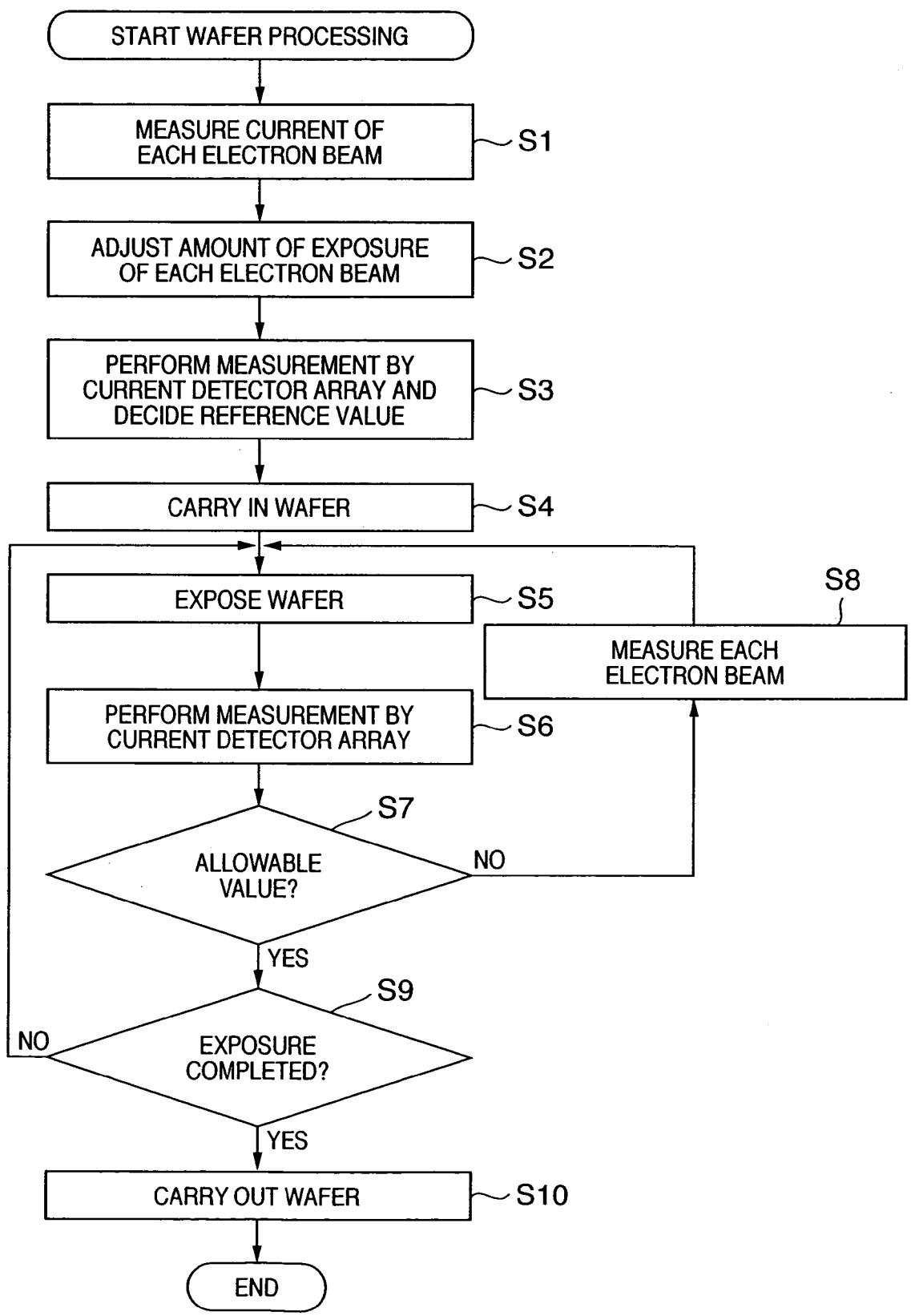
FIG. 5 is a flowchart for describing an exposure process by the exposure apparatus of the first embodiment.

Next, the operation of the electron beam exposure apparatus according to the first embodiment will be described with reference to FIG. 5. The main control system 47 executes the steps shown in FIG. 5 to expose a wafer by the electron beam exposure apparatus.

[Step S1] The main control system 47 controls the blanker-array control circuit 43 so as to select one of the electron beams that reaches the wafer from among the plurality of electron beams formed by the pre-aperture array 3 and aperture array 5 and so as to irradiate the wafer with this electron beam alone. At this time the XY stage 11 is driven by the stage-drive control circuit 46, the Faraday cup 13 is moved to the vicinity of the electron beam selected to reach the wafer and the current of the selected electron beam is detected. Measurement is performed successively in similar fashion also with regard to the other electron beams and all of the irradiation currents of the plurality of electron beams formed by the aperture array are stored in memory.

[Step S2] On the basis of the irradiation currents of all electron beams stored at step S1, the main control system 47 obtains the intensity distribution of the electron beam that actually irradiates the pre-aperture array 3. Further, on the basis of the intensity distribution obtained, the main control system 47 adjusts the collimator lens 2 in such a manner that the irradiation currents of the electron beams are uniformalized. More specifically, the main control system 47 instructs the collimator lens control circuit 41 to adjust the optical power of at least two of the electrostatic lenses 2a, 2b, 2c that construct the collimator lens 2.

[Step S3] Next, with the adjustment at step S2 having been completed, the main control system 47 stores as a reference value the result of current detection by the current detector array 4. That is, the main control system 47 instructs the current-distribution detecting circuit 42 to store, as a reference value, each result of detection by the current detectors that construct the current detector array 4. At this time the current detectors and the results of detection from respective ones of the detectors are stored in correlated form.

[Step S4] A wafer 9 is carried in and placed on the stage 11.

[Step S5] The main control system 47 executes processing to expose the wafer 9. Specifically, the main control system 47 instructs the main-deflector control circuit 44 to collectively deflect a plurality of electron beams by the main deflector 10 and instructs the blanker-array control circuit 43 to turn each electron beam on and off in accordance with the exposure pattern and expose the wafer 9. At this time the XY stage 11 is continuing to move along the X direction.

[Step S6] During the above-described exposure processing, the main control system 47 instructs the current-distribution detecting circuit 42 to detect current by the current detectors that construct the current detector array 4.

[Step S7] The main control system 47 calculates the difference between the current value obtained from each current sensor at step S6 and the reference value set at step S3 and compares the difference with an allowable value. If the difference exceeds the allowable value, it is judged that the electron-beam intensity distribution has developed a non-uniformity that exceeds the allowable range. Accordingly, control proceeds to step S8 and a readjustment is performed in such a manner that the electron-beam intensity distribution is uniformalized. On the other hand, if the difference does not exceed the allowable value, control proceeds to step S9 and exposure processing continues.

[Step S8] The main control system 47 halts exposure processing and adjusts the collimator lens 2 in such a manner that the irradiation current of the electron beam detected by each current detector of the current detector array 4 will become the reference value stored at step S3. That is, the main control system 47 instructs the collimator lens control circuit 41 to adjust the optical power of at least two of the electrostatic lenses 2a, 2b, 2c that construct the collimator lens 2. If the collimator lens 2 is adjusted in such a manner that the results of measurement by the current detectors constituting the current detector array 4 attain the reference value, the intensity distribution of the electron beam that actually irradiates the pre-aperture array 3 will become uniform as was the case originally (at such time that the adjustment of step S2 was performed). It should be noted that the halting of exposure processing mentioned above is such that all of the plurality of electron beams are altered by the blanker array so that the electron beams will not reach the wafer. Further, the timing at which the adjustment of the electron-beam intensity distribution at steps S6 to S8 is executed is optional. However, since halts to exposure processing are included, it is desired that the adjustment be executed at a favorable timing corresponding to the pauses in processing.

[Step S9] It is determined whether exposure has been completed with regard to the entire surface of the wafer 9 and control returns to step S5 if exposure has not been completed. If exposure has been completed, control proceeds to step S10.

[Step S10] The wafer 9 is carried away from the stage 11 and processing is exited. In this embodiment, the collimator lens 2 is adjusted in such a manner that the irradiation current of an electron beam will become a reference value. When the wafer is exposed, however, it is permissible to adjust the irradiation time of each electron beam such that the integrated value of current that irradiates the wafer will fall within the allowable range of values.

Thus, in accordance with the first embodiment, as described above, electron-beam intensity distribution can be evaluated during exposure by measuring, using the current detector array 4, the current value (intensity) of that part of an electron beam, which irradiates the pre-aperture array, that is not used in exposing the wafer. By controlling the collimator lens based upon the result of evaluation, the intensity distribution of the electron beam that irradiates the pre-aperture array can be kept uniform. As a result, the intensities of the plurality of electron beams formed can be kept uniform and both yield and productivity can be improved.

<Second Embodiment>

Figure 6:
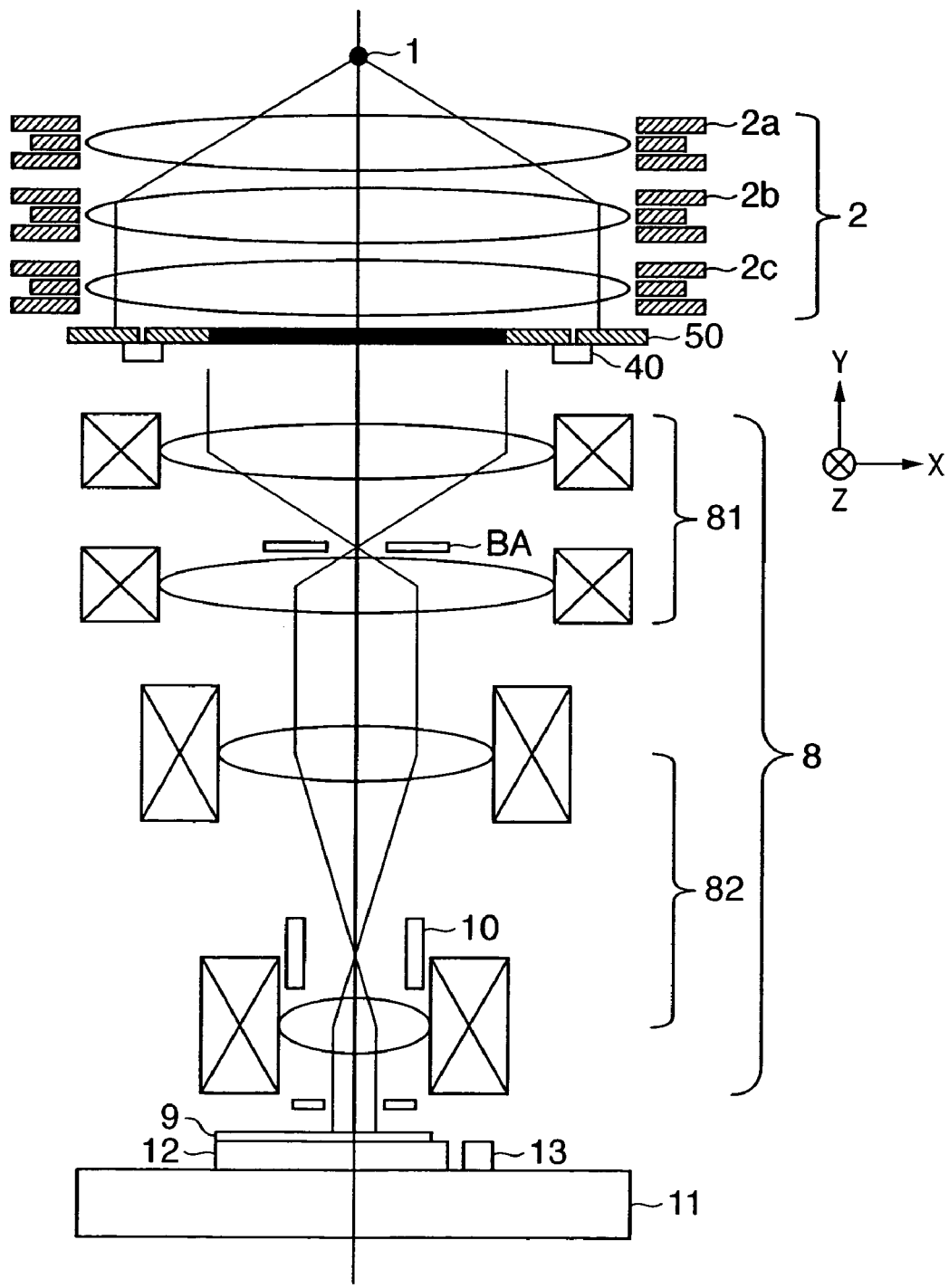
FIG. 6 is a diagram schematically illustrating the principal part of an electron-beam exposure apparatus according to a second embodiment of the present invention.

FIG. 6 is a diagram illustrating an electron-beam exposure apparatus according to a second embodiment of the present invention. Components identical with those of FIG. 1 are designated by like reference characters and need not be described again. The second embodiment will be described with regard to a stencil-mask electron-beam exposure apparatus.

The electron beam from the electron source 1 is made a substantially collimated electron beam by the collimator lens 2 situated at the light-source position of the electron source 1. The substantially collimated electron beam irradiates a stencil mask 50. The latter is composed of a pattern portion 50a (FIG. 7), in which a pattern is formed by parts that transmit the electron beam and parts that do not, and an area other than this portion.

The collimator lens 2 comprises the electrostatic-type electrostatic lenses 2a, 2b, 2c. The intensity distribution of the electron beam that irradiates the stencil mask 50 can be adjusted by regulating the electro-optical power (focal length) of at least two of the electrostatic lenses 2a, 2b, 2c. The electron beam from the pattern portion 50a formed in the stencil mask 50 is demagnified and projected onto the wafer 9 by the demagnifying projection system 8.

Figure 7:
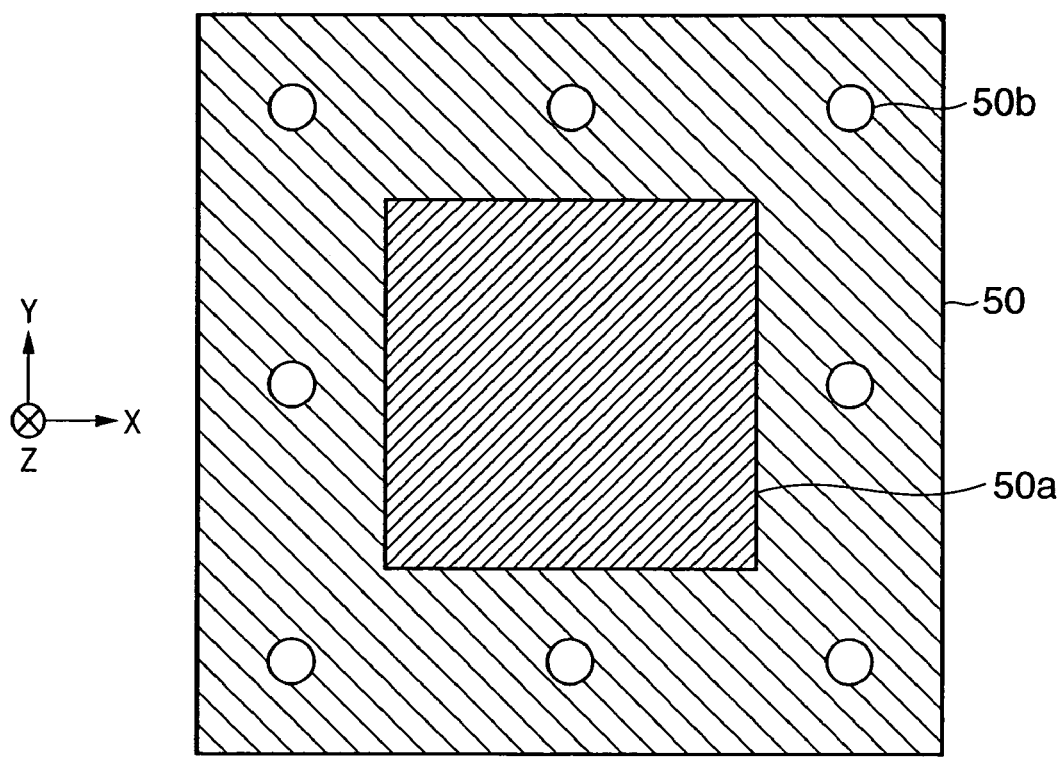
FIG. 7 is a diagram useful in describing a stencil mask according to the second embodiment.

Further, as illustrated in FIG. 7, the stencil mask 50 is formed to have a plurality of apertures 50b at locations other than the pattern portion 50a. A current detector array 40 having current detectors is provided immediately below the apertures 50b and is capable of detecting current that has passed through each aperture 50b.

<Description of operation>

Figure 8:
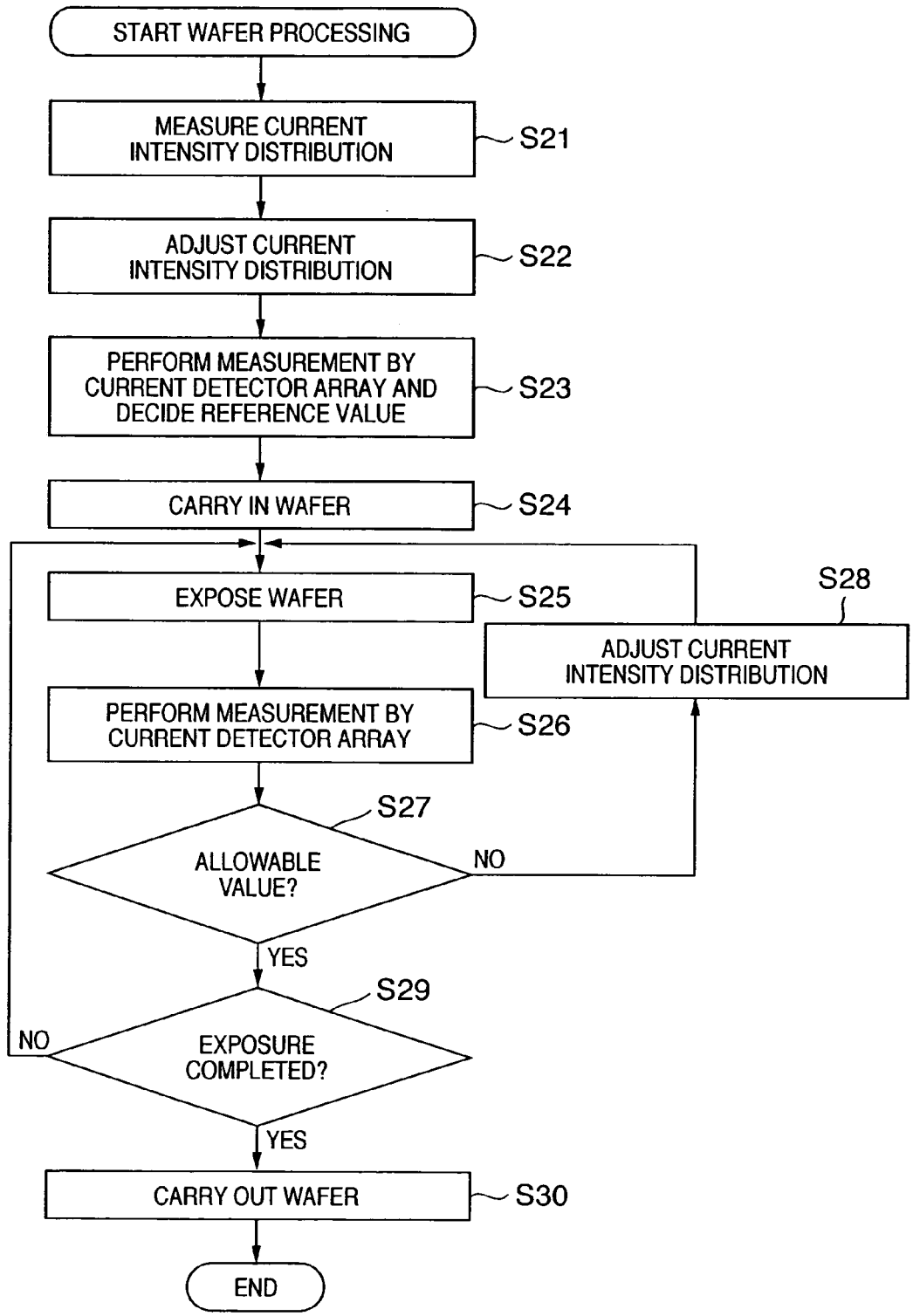
FIG. 8 is a flowchart for describing an exposure process according to the second embodiment.

Next, the operation of the electron-beam exposure apparatus according to the second embodiment will be described with reference to FIG. 8. The configuration of the control system is similar to that of the first embodiment (FIG. 4) and the main control system 47 executes the following steps to expose a wafer by the electron-beam exposure apparatus.

[Step S21] In order to obtain the intensity distribution of the electron beam that irradiates the stencil mask 50, the current at each position is detected using the Faraday cup 13, which detects the electron beam via a pin hole. More specifically, before the stencil mask 50 is mounted in the apparatus, the current ascribable to the electron beam emitted from the electron source 1 is detected at a plurality of positions by the Faraday cup 13. The irradiation current at each position detected by the Faraday cup 13 is stored.

[Step S22] On the basis of the irradiation current at each position stored at step S21, the control system obtains the intensity distribution of the electron beam that actually irradiates the stencil mask 50. Further, on the basis of the intensity distribution obtained, the control system adjusts the optical power of at least two of the electrostatic lenses 2a, 2b, 2c, which construct the collimator lens 2, in such a manner that the irradiation current that irradiates the stencil mask 50 is uniformalized.

[Step S23] With the intensity distribution having been adjusted at step S22, the control system stores as a reference value each result of current detection by the current detectors constructing the current detector array 40. At this time the current detectors and the results of detection from respective ones of the detectors are stored in correlated form.

[Step S24] A wafer 9 is carried in and placed on the stage 11.

[Step S25] The electron beam from the pattern portion 50a of the stencil mask 50 is demagnified and projected onto the wafer 9 by the demagnifying projection system 8. The XY stage 11 is driven step by step and the pattern is successively demagnified and projected upon the wafer 9.

[Step S26] During exposure, the currents ascribable to the electron beams are detected by the current detectors constituting the current detector array 40.

[Step S27] The main control system 47 calculates the difference between the current value obtained from each current sensor at step S26 and the reference value set at step S23 and compares the difference with an allowable value. If the difference exceeds the allowable value, it is judged that the intensity distribution of the electron beam has developed a non-uniformity that exceeds the allowable range. Accordingly, control proceeds to step S28 and a readjustment is performed in such a manner that the intensity distribution of the electron beam is uniformalized. On the other hand, if the difference does not exceed the allowable value, control proceeds to step S29 and exposure processing continues.

[Step S28] The main control system 47 halts exposure processing and adjusts the collimator lens 2 in such a manner that the irradiation current of the electron beam detected by each current detector of the current detector array 40 will become the reference value. That is, the main control system 47 instructs the collimator lens control circuit 41 to adjust the optical power of at least two of the electrostatic lenses 2a, 2b, 2c that construct the collimator lens 2. If the collimator lens 2 is adjusted in such a manner that the results of measurement by the current detectors constituting the current detector array 40 attain the reference value set at step S23, the intensity distribution of the electron beam that actually irradiates the stencil mask 50 will become uniform as was the case originally (at such time that the adjustment of step S2 was performed). It should be noted that the halting of exposure processing mentioned above is such that all of the plurality of electron beams are altered by the blanker array so that the electron beams will not reach the wafer. Further, the timing at which the adjustment of the electron-beam intensity distribution at steps S26 to S28 is executed is optional. However, since halts to exposure processing are included, it is desired that the adjustment be executed at a favorable timing corresponding to the pauses in processing.

[Step S29] It is determined whether exposure has been completed with regard to the entire surface of the wafer 9 and control returns to step S25 if exposure has not been completed. If exposure has been completed, control proceeds to step S30.

[Step S30] The wafer 9 is carried away from the stage 11 and processing is exited.

Thus, in accordance with the second embodiment, as described above, the intensity distribution of an electron beam can be evaluated during exposure by measuring, using the current detector array 40, the current value (intensity) of that part of an electron beam, which irradiates the stencil mask, that is not used in exposing the wafer. By controlling the collimator lens based upon the result of evaluation, the intensity distribution of the electron beam that irradiates the stencil mask can be kept uniform. As a result, the intensity of the electron beam that forms the pattern formed can be kept uniform and both yield and productivity can be improved.

<Third Embodiment>

An embodiment of a method of producing a device utilizing the electron beam exposure apparatus set forth above will now be described.

Figure 9:
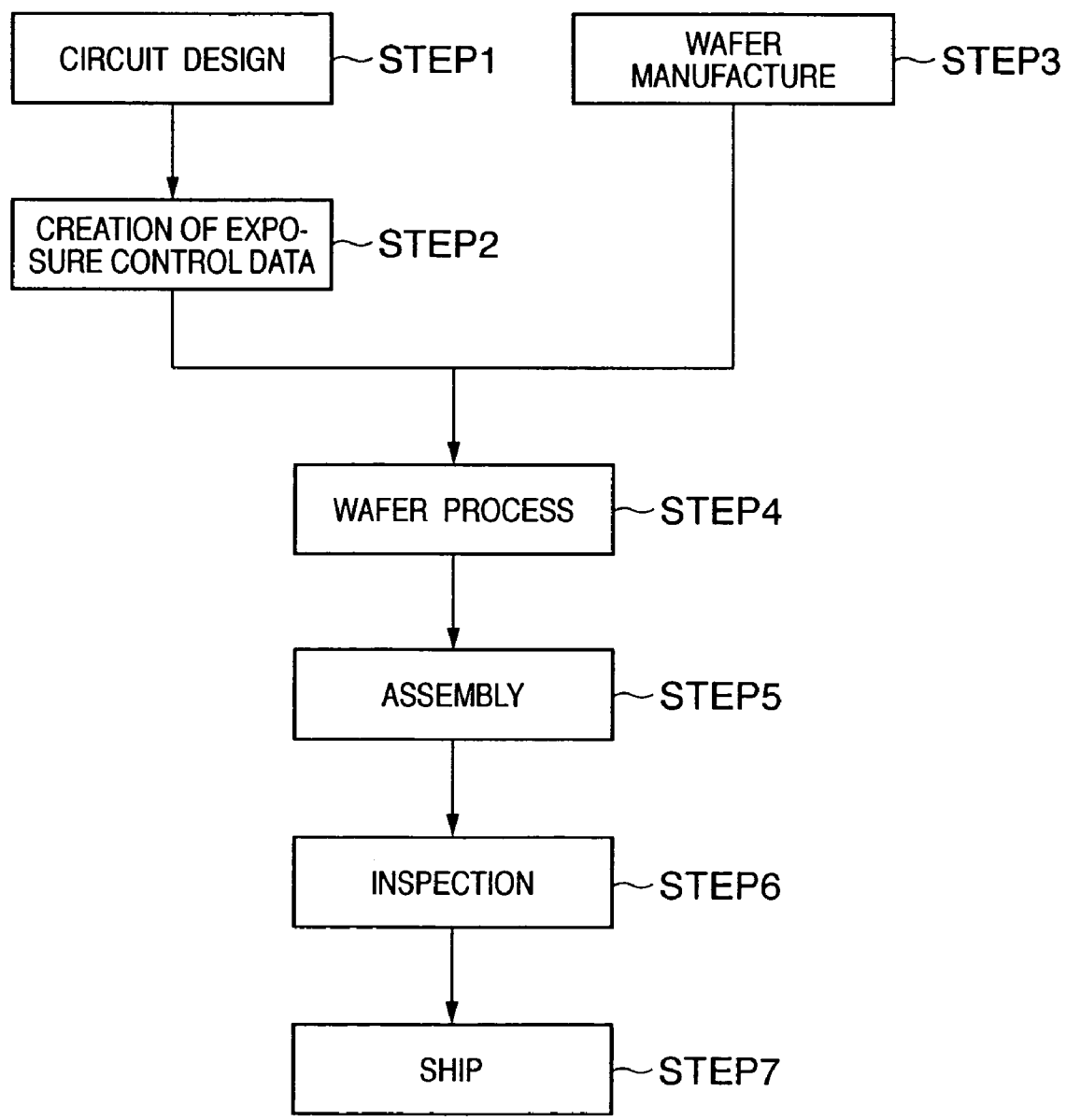
FIG. 9 is a diagram useful in describing the flow of a process for manufacturing a device.

FIG. 9 is a flowchart illustrating the manufacture of a microdevice (a semiconductor chip such as an IC or LSI chip, a liquid crystal panel, a CCD, a thin-film magnetic head, a micromachine, etc.). The circuit of the semiconductor device is designed at step 1 (circuit design). Exposure control data for the exposure apparatus is created based upon the designed circuit pattern at step 2 (creation of exposure control data). A wafer is manufactured using a material such as silicon at step 3 (wafer manufacture). At step 4 (wafer process), which is referred to as a preprocess, an actual circuit is formed on the wafer by lithography using the wafer and the exposure apparatus in which the prepared exposure control data has been entered. At step 5 (assembly), which is referred to as a postprocess, semiconductor chips are formed from the wafer fabricated at step 4. This postprocess includes an assembly process (dicing and bonding) and a packaging process (chip encapsulation). The semiconductor device fabricated at step 5 is subjected to inspections such as a test for confirmation of operation and a test of durability at step 6 (inspection). These steps are executed to complete the manufacture of the semiconductor device, which is shipped at step 7.

Figure 10:
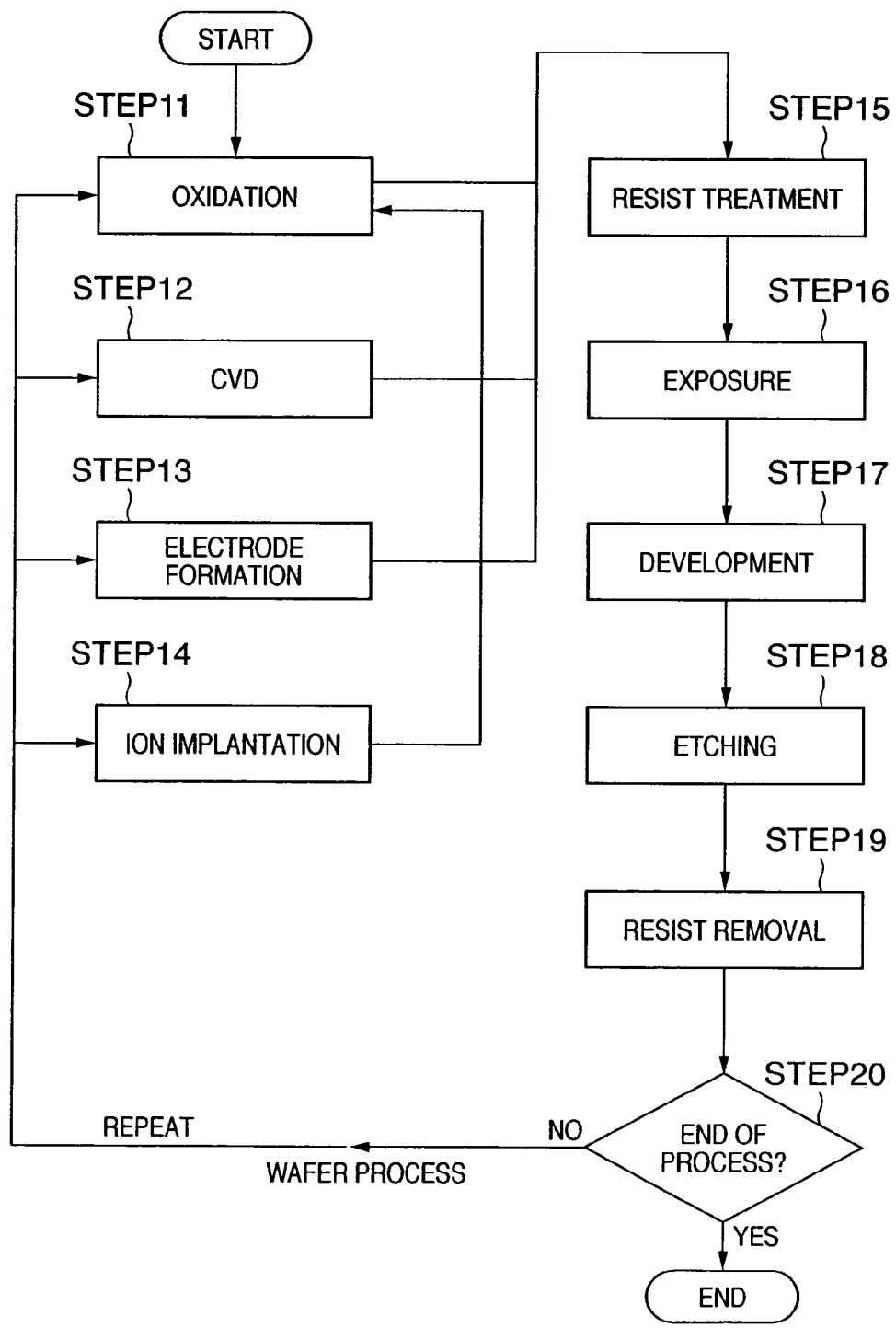
FIG. 10 is a diagram useful in describing a wafer process.

FIG. 10 is a flowchart showing the wafer process in detail. The surface of the wafer is oxidized at step 11 (oxidation) and an insulating film is formed on the wafer surface at step 12 (CVD). An electrode is formed on the wafer by vapor deposition at step 13 (electrode formation), and ions are implanted in the wafer at step 14 (ion implantation). The wafer is coated with a photosensitive agent at step 15 (resist treatment). The circuit pattern is printed on the wafer by exposure at step 16 (exposure) using the exposure apparatus described above. The exposed wafer is developed at step 17 (development) and portions of the wafer other than those having the developed resist image are etched away at step 18 (etching). The unnecessary resist left after etching is removed at step 19 (resist removal). Repeating these steps forms multiple circuit patterns on the wafer.

If the method of manufacture according to this embodiment is used, a semiconductor device having a high degree of integration, which is difficult to manufacture conventionally, can be manufactured at low cost.

In accordance with each of the foregoing embodiments, as described above, a charged-particle-beam exposure apparatus of high reliability can be provided by making it possible to evaluate the uniformity of the intensity distribution of a charge-particle beam even during exposure in the charge-particle-beam exposure apparatus. Further, if a device is manufactured using this apparatus, it is possible to manufacture devices in a yield higher than heretofore.

Thus, in accordance with the present invention as described above, the intensity distribution of a charged-particle beam can be controlled appropriately by evaluating the uniformity of the charged-particle beam even during exposure, and it is possible to implement highly reliable exposure using a charge-particle beam.

As many apparently widely different embodiments of the present invention can be made without departing from the spirit and scope thereof, it is to be understood that the invention is not limited to the specific embodiments thereof except as defined in the appended claims.

What is claimed is:

1. A charged-particle-beam exposure apparatus for exposing a substrate using a charged-particle-beam, comprising:

a charged-particle source configured to emit a charged-particle beam;

a plate configured to selectively passing the charged-particle beam for exposing the substrate;

a detecting unit configured to detect intensity of that part of the charged-particle beam, which has been emitted from said charged-particle source, said detecting unit detects the intensity of the charged-particle beam at a plurality of locations on the plate in an area not utilized in exposing the substrate; and an adjusting unit configured to adjust intensity distribution of the charged-particle beam based upon result of detection by said detecting unit.

2. The apparatus according to claim 1, wherein said adjusting unit adjusts optical power of electrostatic lenses that construct a collimator lens for substantially collimating the charged-particle beam that has been emitted from said charged-particle source.

3. The apparatus according to claim 1, further comprising a storage unit configured to store, as a reference value, the intensity detected by said detecting unit in a state in which the intensity distribution of the charged-particle beam can be regarded as uniform;

wherein said unit adjusts the intensity distribution of the charged particles based upon a difference between the intensity detected by said detecting unit and the reference value.

4. The apparatus according to claim 3, wherein said adjusting unit adjusts the intensity distribution of the charged-particle beam in such a manner that the intensity detected by said detecting unit will become the reference value.

5. The apparatus according to claim 3, further comprising:

a measuring unit configured to measure the intensity distribution of the charged-particle beam on the substrate to be exposed; and a setting unit configured to set the intensity of the charged-particle beam, which has been detected by said detecting unit, to the reference value after the intensity distribution of the charged-particle beam has been adjusted to uniformity based upon the intensity distribution measured by said measuring unit.

6. The apparatus according to claim 3, wherein said adjusting unit halts processing for exposing the substrate and executes adjustment of the intensity distribution of the charged-particle beam if the difference between the intensity detected by said detecting unit and the reference value exceeds an allowable value.

7. The apparatus according to claim 1, wherein said plate has a plurality of apertures for dividing the charged-particle beam from said charged-particle source into a plurality of charged-particle beams used in exposing the substrate and wherein the plurality of locations are in a portion where the plurality of apertures are non-existent.

8. The apparatus according to claim 1, wherein said plate comprises a stencil mask for allowing the charged-particle beam from said charged-particle source to pass through in accordance with a pattern and expose the substrate and wherein the plurality of locations are in an area of the stencil mask other than an area in which the pattern is present.

9. A method of controlling a charged-particle-beam exposure apparatus for exposing a substrate using a charged-particle beam, comprising:

a detecting step of detecting, by a detector provided for the purpose of detecting intensity of a charged-particle beam, intensity of that part of the charged-particle beam, which has been emitted from a charged-particle source, said detecting step detects the intensity of the charged-particle beam at a plurality of locations on a plate, configured to selectively pass the charged-particle beam for exposing the substrate, in an area not utilized in exposing the substrate; and an adjusting step of adjusting intensity distribution of the charged-particle beam based upon result of detection at said detecting step.

10. The method according to claim 9, wherein said adjusting step adjusts optical power of electrostatic lenses that construct a collimator lens for substantially collimating the charged-particle beam that has been emitted from the charged-particle source.

11. The method according to claim 9, further comprising a storage step of storing, as a reference value, the intensity detected by said detector in a state in which the intensity distribution of the charged-particle beam can be regarded as uniform;

wherein said adjusting step adjusts the intensity distribution of the charged particles based upon a difference between the intensity detected at said detecting step and the reference value.

12. The method according to claim 11, wherein said adjusting step adjusts the intensity distribution of the charged-particle beam in such a manner that the intensity detected at said detecting step will become the reference value.

13. The method according to claim 11, further comprising:

a measuring step of measuring the intensity distribution of the charged-particle beam on the substrate to be exposed; and a setting step of setting the intensity of the charged-particle beam, which has been detected by said detector, to the reference value after the intensity distribution of the charged-particle beam has been adjusted to uniformity based upon the intensity distribution measured at said measuring step.

14. The method according to claim 11, wherein said adjusting step halts processing for exposing the substrate and executes adjustment of the intensity distribution of the charged-particle beam if the difference between the intensity detected at said detecting step and the reference value exceeds an allowable value.

15. The method according to claim 9, wherein the plate has a plurality of apertures for dividing the charged-particle beam from said charged-particle source into a plurality of charged-particle beams used in exposing the substrate and wherein the plurality of locations are in a portion where the plurality of apertures are non-existent.

16. The method according to claim 9, wherein the plate has a stencil mask for allowing the charged-particle beam from said charged-particle source to pass through in accordance with a pattern and expose the substrate and wherein the plurality of locations are in an area of the stencil mask other than an area in which the pattern is present.

* * * * *